United States Patent
Tsuchida

(10) Patent No.: US 9,974,207 B2
(45) Date of Patent: May 15, 2018

(54) ELECTRONIC APPARATUS

(71) Applicant: Sony Computer Entertainment Inc., Tokyo (JP)

(72) Inventor: Shinya Tsuchida, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 138 days.

(21) Appl. No.: 14/284,759

(22) Filed: May 22, 2014

(65) Prior Publication Data

US 2014/0362529 A1    Dec. 11, 2014

(30) Foreign Application Priority Data

Jun. 7, 2013  (JP) .................................. 2013-121343

(51) Int. Cl.
*H05K 7/20*    (2006.01)

(52) U.S. Cl.
CPC ..... *H05K 7/20181* (2013.01); *H05K 7/20127* (2013.01)

(58) Field of Classification Search
CPC ......... G06F 1/00–1/3296; H05K 7/202; H05K 7/20181
USPC ......... 361/679.055–679.061, 679.46–679.54, 361/724–727
See application file for complete search history.

(56) References Cited

U.S. PATENT DOCUMENTS

| 5,559,673 A * | 9/1996 | Gagnon | G06F 1/20 165/122 |
| 5,596,483 A * | 1/1997 | Wyler | G06F 1/18 361/679.47 |
| 6,011,689 A * | 1/2000 | Wrycraft | G06F 1/20 361/679.31 |

(Continued)

FOREIGN PATENT DOCUMENTS

| CN | 201563338 U | 8/2010 |
| JP | 09200665 A | 7/1997 |

(Continued)

OTHER PUBLICATIONS

Office Action for corresponding Japanese Patent Application No. 2013121343, dated Feb. 3, 2015.

(Continued)

*Primary Examiner* — Robert J Hoffberg
*Assistant Examiner* — Matt Dhillon
(74) *Attorney, Agent, or Firm* — Matthew B. Dernier, Esq.

(57) ABSTRACT

Disclosed herein is an electronic apparatus including a component disposed inside the electronic apparatus, a vent that is located in a first direction with respect to the component disposed inside the electronic apparatus and is opened toward the external of the electronic apparatus, a plurality of first louvers that are provided in the vent and are lined in a second direction perpendicular to the first direction when the vent is viewed along the first direction, and a plurality of second louvers that are located between the (Continued)

component disposed inside the electronic apparatus and the plurality of first louvers and are lined in the second direction when the vent is viewed along the first direction. A straight line that passes between adjacent two first louvers and is along the first direction intersects any of the plurality of second louvers.

6 Claims, 6 Drawing Sheets

(56) References Cited

U.S. PATENT DOCUMENTS

| | | | | |
|---|---|---|---|---|
| 6,030,186 | A * | 2/2000 | Tang | F04D 17/165 415/119 |
| 6,813,149 | B2 * | 11/2004 | Faneuf | H05K 7/20727 361/679.49 |
| 6,963,489 | B2 * | 11/2005 | Askeland | G06F 1/182 165/121 |
| 7,079,388 | B2 * | 7/2006 | Faneuf | H05K 7/20727 361/679.51 |
| 7,209,352 | B2 * | 4/2007 | Chen | H05K 7/20727 165/120 |
| 7,394,654 | B2 * | 7/2008 | Zieman | G06F 1/20 312/236 |
| 7,522,426 | B2 * | 4/2009 | Koga | H05K 7/1457 361/788 |
| 7,742,296 | B2 * | 6/2010 | Lai | G06F 1/20 165/80.3 |
| 7,894,193 | B2 * | 2/2011 | Lai | G06F 1/188 312/223.2 |
| 7,957,133 | B2 * | 6/2011 | Zieman | G06F 1/20 312/236 |
| 7,997,964 | B2 * | 8/2011 | Gehring | B60H 1/345 454/152 |
| 8,072,753 | B2 * | 12/2011 | Sun | G06F 1/181 361/694 |
| 8,081,444 | B2 * | 12/2011 | Xiao | G06F 1/20 312/223.2 |
| 8,228,671 | B2 | 7/2012 | Ikeda | |
| 8,243,445 | B2 | 8/2012 | Hasegawa | |
| 8,257,156 | B2 * | 9/2012 | Shabany | H05K 7/20572 361/695 |
| 8,737,067 | B1 * | 5/2014 | Kim | H05K 7/1492 342/175 |
| 2003/0124971 | A1 * | 7/2003 | Williams | G06F 1/20 454/184 |
| 2004/0067731 | A1 * | 4/2004 | Brinkerhoff | F24F 7/00 454/325 |
| 2005/0007737 | A1 * | 1/2005 | Chen | H05K 5/0213 361/690 |
| 2005/0241810 | A1 * | 11/2005 | Malone | H05K 7/20727 165/122 |
| 2008/0113603 | A1 * | 5/2008 | Atallah | G06F 1/20 454/184 |
| 2010/0254086 | A1 * | 10/2010 | Ikeda | H05K 7/20163 361/697 |
| 2012/0009861 | A1 * | 1/2012 | Mercey | B60H 1/3421 454/162 |

FOREIGN PATENT DOCUMENTS

| | | |
|---|---|---|
| JP | 2001274299 A | 10/2001 |
| JP | 2005-301088 A | 10/2005 |
| JP | 2005274730 A | 10/2005 |
| JP | 2010245201 A | 10/2010 |

OTHER PUBLICATIONS

Office Action for corresponding Japanese Patent Application No. 2011112905, dated Feb. 3, 2015.
Office Action for corresponding Chinese Patent Application No. 201410240183.4, 11 pages, dated Apr. 25, 2017.

* cited by examiner

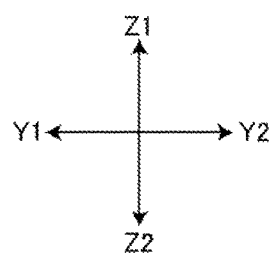
FIG. 6
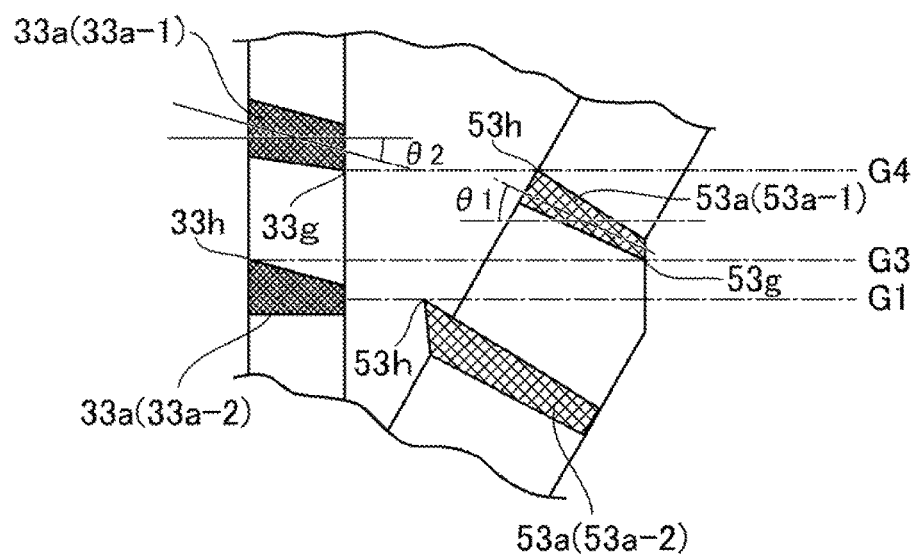

ELECTRONIC APPARATUS

BACKGROUND

The present disclosure relates to the structure of a vent of an electronic apparatus.

As a related art, an electronic apparatus that sucks in the external air by driving of a cooling fan and cools heat generating components such as integrated circuits and power supply circuits by the sucked air has been utilized. In this kind of electronic apparatus, an exhaust port used to discharge the sucked air is made. In U.S. Pat. No. 8,243,445, plural louvers lined in the vertical direction are provided for the exhaust port. By the louvers, components (in this patent document, power supply circuit) disposed inside the electronic apparatus can be prevented from being visible from the external.

SUMMARY

To prevent exposure of the components disposed inside the electronic apparatus, the interval between two adjacent louvers needs to be set short. However, decreasing the interval between the louvers causes a problem of the lowering of the ventilation efficiency.

There is a need for the present disclosure to provide an electronic apparatus allowing enhancement in the ventilation efficiency with suppression of exposure of components disposed inside the electronic apparatus.

According to an embodiment of the present disclosure, there is provided an electronic apparatus including a component disposed inside the electronic apparatus, a vent configured to be located in a first direction with respect to the component disposed inside the electronic apparatus and be opened toward the external of the electronic apparatus, a plurality of first louvers configured to be provided in the vent and be lined in a second direction perpendicular to the first direction when the vent is viewed along the first direction, and a plurality of second louvers configured to be located between the component disposed inside the electronic apparatus and the plurality of first louvers and be lined in the second direction when the vent is viewed along the first direction. A straight line that passes between adjacent two first louvers and is along the first direction intersects any of the plurality of second louvers. According to this structure, the interval between the first louvers can be increased and thus the ventilation efficiency can be enhanced. Furthermore, exposure of the component disposed inside the electronic apparatus through the vent can be suppressed by the second louvers.

BRIEF DESCRIPTION OF THE DRAWINGS

FIG. 6 is a diagram adopted to explain the placement of first louvers and second louvers.

DETAILED DESCRIPTION OF THE PREFERRED EMBODIMENT

Figure 1:
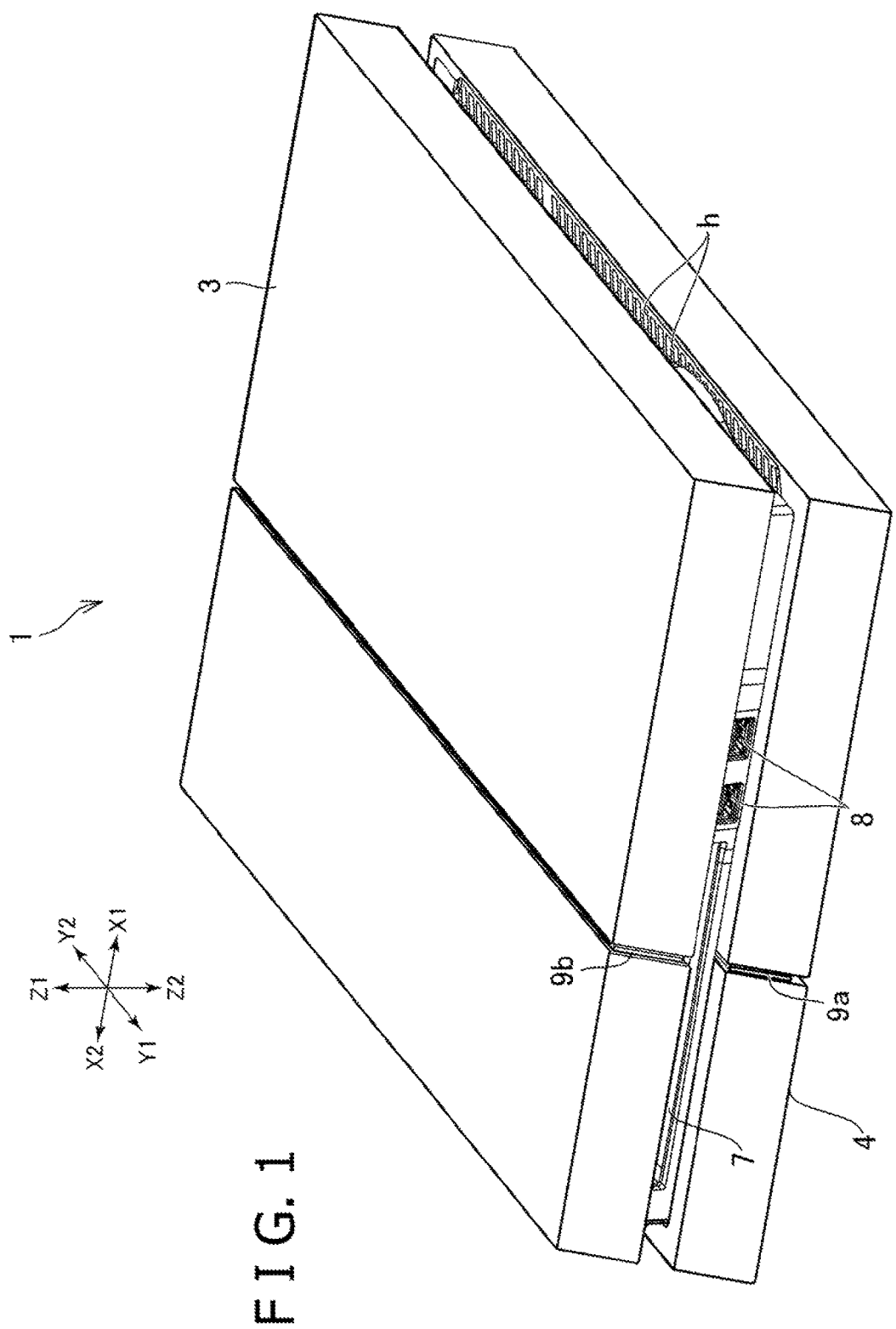
FIG. 1 is a perspective view of an electronic apparatus according to one embodiment of the present disclosure.
Figure 2:
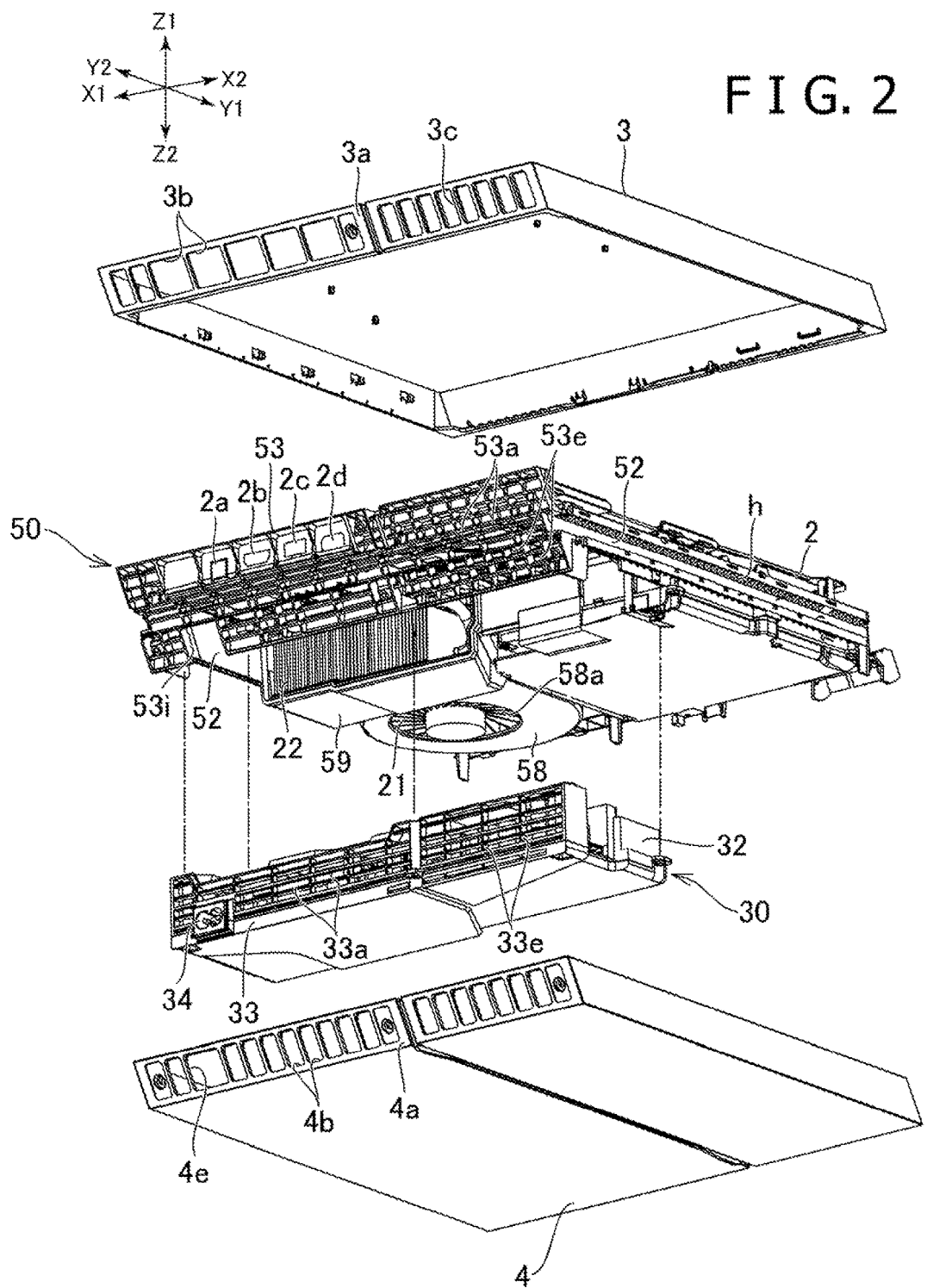
FIG. 2 is an exploded perspective view showing the back side of the electronic apparatus.
Figure 3:
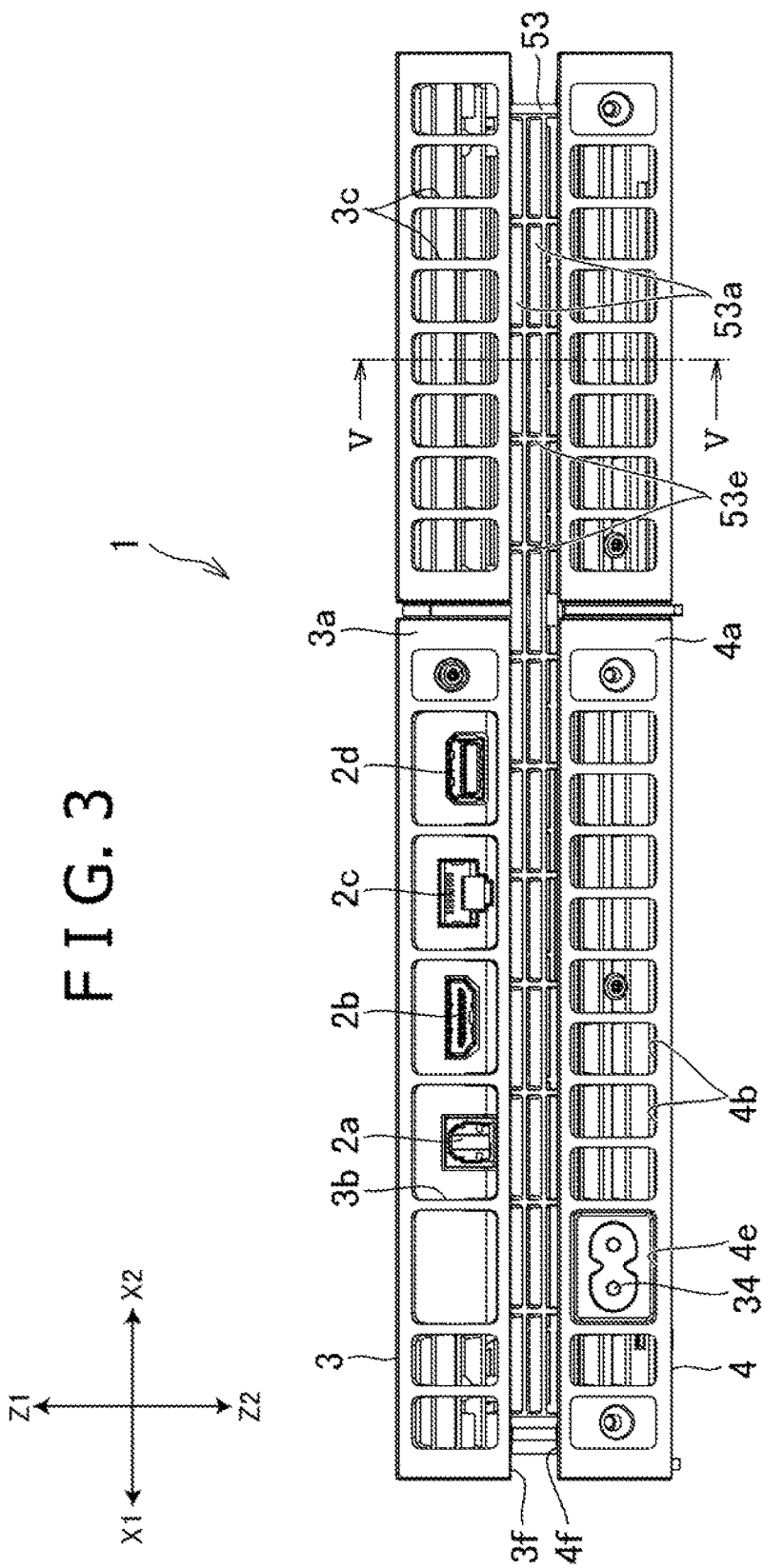
FIG. 3 is a back view of the electronic apparatus.
Figure 4:
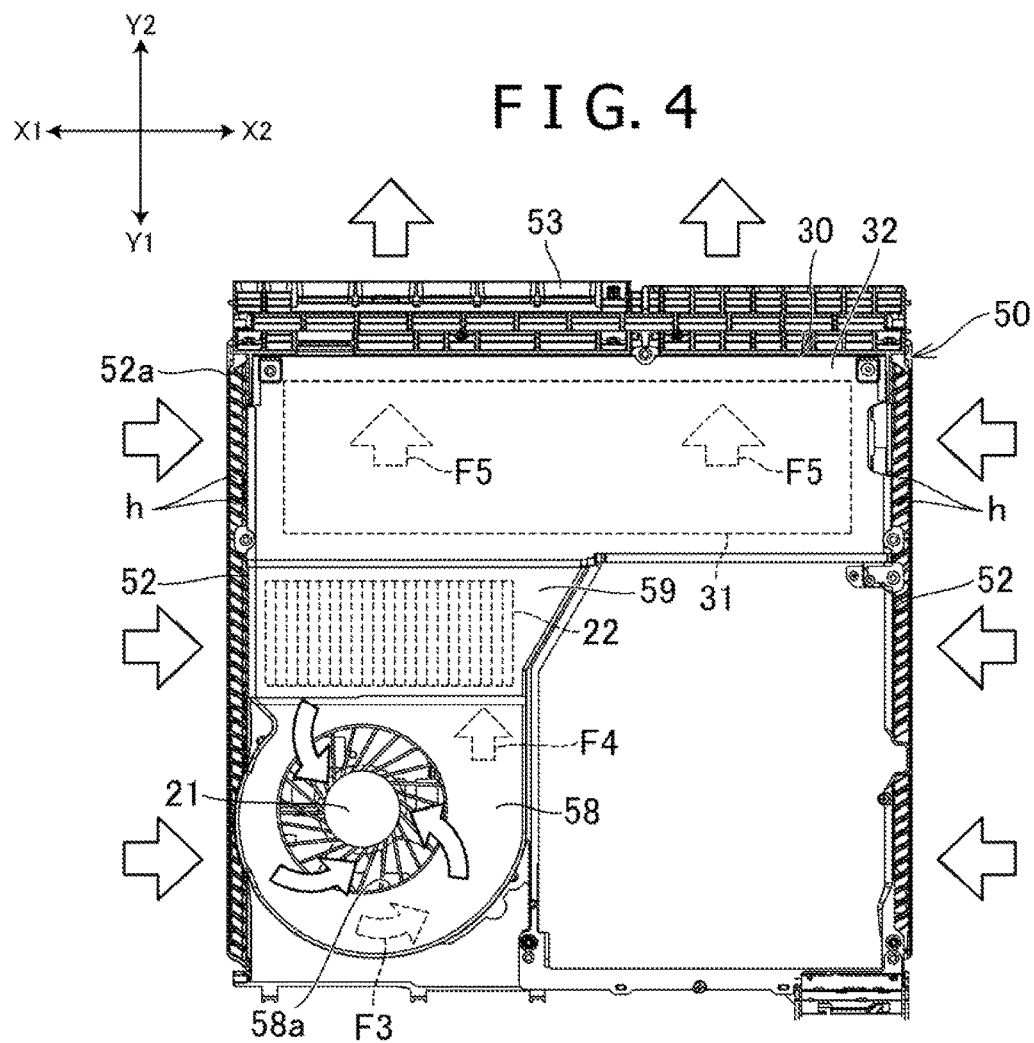
FIG. 4 is a bottom view of a state in which covers of the electronic apparatus are removed.
Figure 5:
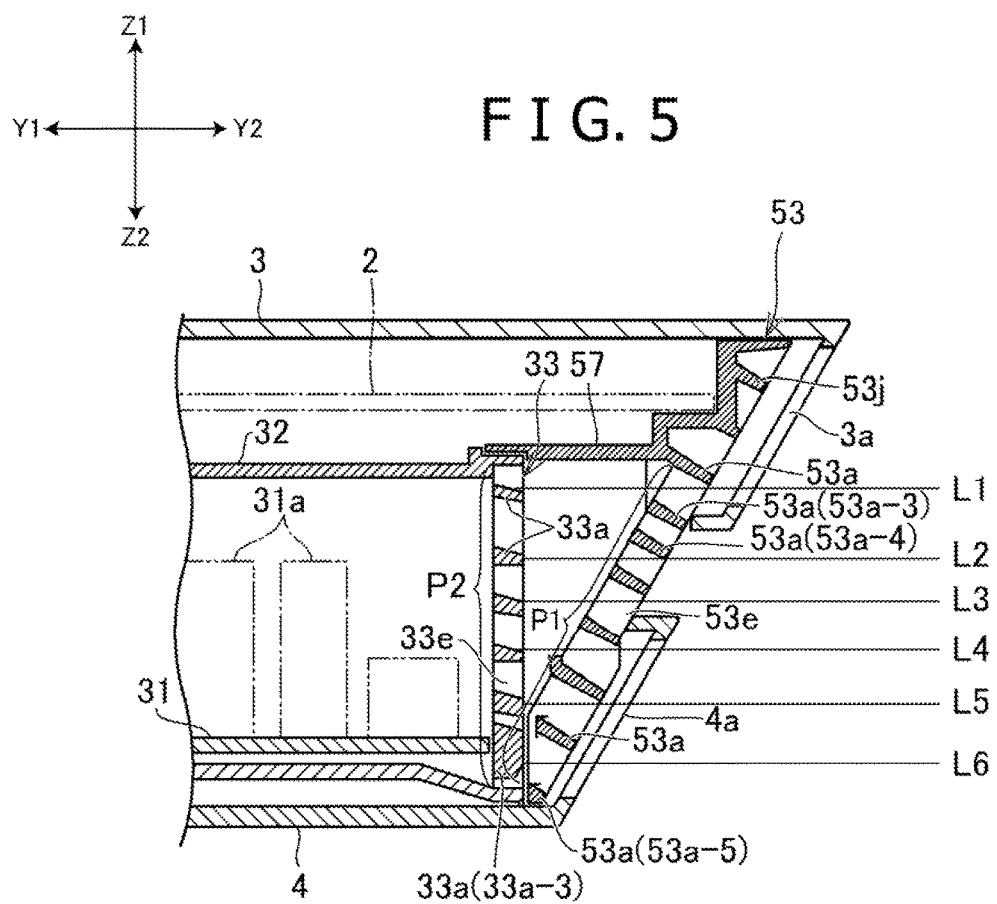
FIG. 5 is a sectional view along line V-V in FIG. 3.

One embodiment of the present disclosure will be described below with reference to the drawings. FIG. 1 is a perspective view of an electronic apparatus 1 according to one embodiment of the present disclosure. FIG. 2 is an exploded perspective view of the electronic apparatus 1 and shows the back side of components that form the electronic apparatus 1. FIG. 3 is a back view of the electronic apparatus 1. FIG. 4 is a bottom view of a main body of the electronic apparatus 1 including a frame 50, a cooling fan 21, and a power supply unit 30. FIG. 5 is a sectional view along line V-V shown in FIG. 3. In the following description, directions of X1 and X2 shown in FIG. 1 are defined as the left direction and the right direction, respectively. Furthermore, directions of Y1 and Y2 are defined as the front direction and the back direction, respectively, and directions of Z1 and Z2 are defined as the upward direction and the downward direction, respectively.

The electronic apparatus 1 is an entertainment device that functions as e.g. a game device and audio-visual apparatus. The electronic apparatus 1 outputs, to a display device such as a television, moving image data generated by execution of a game program, video-audio data acquired from a recording medium such as an optical disc and/or video-audio data acquired via a network. As shown in FIG. 1, on a front surface of the electronic apparatus 1, an insertion slot 7 in which to insert an optical disc and a connector 8 used to connect a device such as a controller are provided. Furthermore, a power button 9b and an eject button 9a of the optical disc are provided on the front surface of the electronic apparatus 1. The electronic apparatus 1 is not limited to the entertainment device such as a game device and may be a personal computer.

As shown in FIG. 2, the electronic apparatus 1 has the frame 50. A circuit board 2 is attached to the upper side of the frame 50. In the circuit board 2, integrated circuits such as a CPU (Central Processing Unit) for overall control of the electronic apparatus 1 and a memory are mounted. To a lower surface of the circuit board 2, a heatsink 22 thermally connected to the integrated circuits mounted on the circuit board 2 is attached. Furthermore, the cooling fan 21 is disposed in front of the heatsink 22. The cooling fan 21 is so disposed that its rotation center line is oriented along a thickness direction of the circuit board 2 (here, vertical direction). A recess in which to house the heatsink 22 and the cooling fan 21 is formed in the frame 50. In other words, the frame 50 has a housing wall 59 that covers the lower side, right side, and left side of the heatsink 22 and a housing wall 58 that covers the outer circumference and lower side of the cooling fan 21. The housing wall 58 is joined to the housing wall 59.

As shown in FIG. 2, the electronic apparatus 1 has a power supply unit 30. The power supply unit 30 has a substrate 31 (see FIG. 5) of a power supply circuit and a case 32 to house the substrate 31. The frame 50 has a back wall 53 forming a back surface of the electronic apparatus 1 and left and right sidewalls 52 forming side surfaces of the electronic apparatus 1. The power supply unit 30 is disposed between the heatsink 22 and the back wall 53 (see FIG. 4). The case 32 is a substantially rectangular parallelepiped. The width of the case 32 in the left-right direction corresponds to the interval between the left and right sidewalls 52 of the frame 50. The case 32 is disposed between the sidewalls 52. The case 32 is attached to the frame 50 by fastening parts such as screw and bolt.

An opening is formed on the front side of the case 32. As shown in FIG. 2, the housing wall 59 to house the heatsink 22 is opened toward the back side. The opening of the case 32 is connected to the opening of the housing wall 59. In the case 32 and the back wall 53 of the frame 50, vents P2 and P1, respectively, to be described later are formed. The vents P2 and P1 of the example described here are exhaust ports adopted to discharge the air inside the electronic apparatus 1 to the external. An air flow path partitioned from the external is formed between the cooling fan 21 and the vent P1. Specifically, air F3 discharged to the outer circumference of the cooling fan 21 by driving thereof flows in a flow path defined by the housing wall 58 and the circuit board 2 in a circumferential direction of the cooling fan 21. Thereafter, as shown by F4 in FIG. 4, the air flows backward in a flow path defined by the housing wall 59 and the circuit board 2 and passes through the heatsink 22. Then, the air flows into the case 32 from the opening formed on the front side of the case 32. As shown by F5 in FIG. 4, the air flows backward in a flow path defined by the case 32 and passes through the vents P2 and P1 to be discharged to the back side of the electronic apparatus 1.

As shown in FIG. 2, the electronic apparatus 1 has an upper cover 3 and a lower cover 4. The upper cover 3 covers the upper side of the main body of the electronic apparatus 1 (frame 50 and the above-described components attached to the frame 50 (circuit board 2, power supply unit 30, and so forth)), and the lower cover 4 covers the lower side of the main body of the electronic apparatus 1.

As shown in FIG. 1, the electronic apparatus 1 has plural air intake holes h in its side surface. In the example described here, a groove is formed in the side surface of the electronic apparatus 1 and the plural air intake holes h lined in the front-back direction are formed in an inner surface of the groove. The air sucked through the air intake holes h passes between the main body of the electronic apparatus 1 and the lower cover 4 and between the main body of the electronic apparatus 1 and the upper cover 3 to flow into the cooling fan 21. Here, the main body of the electronic apparatus 1 refers to the part disposed between the two covers 3 and 4, including the frame 50, the circuit board 2 attached thereto, the power supply unit 30, the cooling fan 21, and so forth. The housing wall 58 of the frame 50 has an opening 58a at a position corresponding to the cooling fan 21 (see FIG. 2). The air flowing between the main body of the electronic apparatus 1 and the lower cover 4 passes through the opening 58a to flow into the cooling fan 21. The circuit board 2 also has a hole (not shown) at a position corresponding to the cooling fan 21. The air flowing between the main body of the electronic apparatus 1 and the upper cover 3 passes through the hole of the circuit board 2 to flow into the cooling fan 21.

The electronic apparatus 1 has a vent opened toward the external in its back surface. As shown in FIG. 5, the electronic apparatus 1 of the example described here has the vent P1 adopted to discharge the air in the electronic apparatus 1 to the external. The vent P1 is formed in the back wall 53 of the frame 50. In the vent P1, plural first louvers 53a disposed at intervals from each other are provided. The back wall 53 is formed by the plural first louvers 53a. When the vent P1 is viewed from the back side, the plural first louvers 53a are lined in the vertical direction. In the example of FIG. 5, the back wall 53 is inclined from the direction perpendicular to the bottom surface of the electronic apparatus 1 (i.e. vertical direction) and the plural first louvers 53a are lined in a direction oblique to the vertical direction. Specifically, the back wall 53 is obliquely disposed in such a manner that its upper edge is located backward of its lower edge, and the plural first louvers 53a are obliquely lined in an upward and backward direction in matching with the inclination of the back wall 53. The plural first louvers 53a are substantially parallel to each other.

As shown in FIG. 5, in the vent P1, a support part 53e extending along the vertical direction is formed. The first louvers 53a are supported by the support part 53e. Plural support parts 53e lined at intervals in the left-right direction are provided in the vent P1 (see FIG. 3).

Each first louver 53a has a plate shape extending along the left-right direction. Furthermore, each first louver 53a is inclined with respect to the front-back direction. Specifically, the first louver 53a has a front edge and a back edge located on opposite sides to each other in the front-back direction and is so inclined that the position of the back edge is lower than that of the front edge. Thus, the air is obliquely discharged toward the back lower side through the vent P1.

As shown in FIG. 2, in the back wall 53 of the frame 50, openings used to backward expose connectors 2a to 2d attached to a back edge of the circuit board 2 are formed. The connectors 2a to 2d are provided at an upper part of the back wall 53. The air flowing in the above-described air flow path is warmed in the process of the passage through the heatsink 22 and the power supply circuit. Because the vent P1 obliquely discharges the air toward the lower back side, it is possible to suppress impingement of the air discharged from the vent P1 on cables connected to the connectors 2a to 2d.

Components as a cooling target are disposed on the front side of the vent P1. As shown in FIG. 5, in the example described here, the substrate 31 of the power supply circuit is disposed as the cooling target on the front side of the vent P1. The substrate 31 has plural electronic components 31a forming the power supply circuit. Plural second louvers 33a are disposed between the substrate 31 and the vent P1.

In the example described here, the second louvers 33a are formed in the case 32 to house the substrate 31. Specifically, the vent P2 is formed in a back wall 33 of the case 32 and the plural second louvers 33a are provided in the vent P2. The back wall 33 is formed by the plural second louvers 33a. Each second louver 33a is so formed as to extend along the left-right direction. When the vent P1 is viewed from the back side, the plural second louvers 33a are lined in the vertical direction. In the example described here, the back wall 33 of the case 32 is disposed substantially perpendicular to the front-back direction differently from the back wall 53 of the frame 50. That is, the back wall 33 is formed perpendicular to the bottom surface of the electronic apparatus 1 (i.e. formed along the vertical direction). Therefore, the plural second louvers 33a are lined in the vertical direction in matching with the placement of the back wall 33. The air flowing backward in the case 32 passes through the two vents P2 and P1 to be discharged to the back side of the electronic apparatus 1.

A support part 33e extending along the vertical direction is provided in the vent P2. The second louvers 33a are supported by the support part 33e. Plural support parts 33e lined in the left-right direction are provided in the vent P2. Preferably, the positions of the support parts 33e in the left-right direction correspond with those of the support parts 53e of the vent P1. This can reduce the influence of the support part 33e on the ventilation efficiency.

As shown in FIG. 5, a straight line that is along the front-back direction and passes between two first louvers 53a adjacent in the vertical direction (e.g. L1 to L6 in FIG. 5) intersects the second louver 33a. In other words, the straight line along the front-back direction passing between the adjacent two first louvers 53a (straight line that does not intersect the first louver 53a) surely intersects the second louver 33a. Therefore, when the vent P1 is viewed from the back side, the line of sight passing between the adjacent two first louvers 53a is blocked by the second louver 33a. As a result, exposure of the substrate 31 to the back side through the vent P1 can be suppressed.

FIG. 6 is a diagram used to explain the placement of the first louvers 53a and the second louvers 33a. In this diagram, two first louvers 53a-1 and 53a-2 representative of the plural first louvers 53a and two second louvers 33a-1 and 33a-2 representative of the plural second louvers 33a are shown. In description made with reference to this diagram, symbol 53a-1 is used when a mention is made of the first louver 53a located on the upper side in the two first louvers 53a, and symbol 53a-2 is used when a mention is made of the first louver 53a located on the lower side. Furthermore, symbol 33a-1 is used when a mention is made of the second louver 33a located on the upper side in the two second louvers 33a, and symbol 33a-2 is used when a mention is made of the second louver 33a located on the lower side.

As shown in FIG. 6, a lower end 53g of the first louver 53a-1 located on the upper side is located upward of a straight line G1 passing through an upper end 53h of the first louver 53a-2 located on the lower side. That is, a straight line along the front-back direction passing through the lower end or upper end of the first louver 53a does not intersect another first louver 53a adjacent to it. Therefore, the adjacent two first louvers 53a do not have an overlapping part when being viewed along the front-back direction. Thus, the interval between the two first louvers 53a is large and the ventilation efficiency of the vent P1 can be ensured.

The straight line along the front-back direction passing between the lower end 53g and the upper end 53h of the first louver 53a intersects the second louver 33a. Referring to FIG. 6, a straight line G3 passing through the lower end 53g of the first louver 53a-1 located on the upper side and the straight line G1 passing through the upper end 53h of the first louver 53a-2 located on the lower side both intersect the second louver 33a-2. Thus, the visibility of the substrate 31 through the gap between the two first louvers 53a is suppressed by the second louver 33a.

A lower end 33g of the second louver 33a-1 located on the upper side is located upward of the straight line G3 along the front-back direction passing through an upper end 33h of the second louver 33a-2 located on the lower side. That is, a straight line along the front-back direction passing through the upper end or lower end of the second louver 33a does not intersect another second louver 33a adjacent to it. Therefore, the adjacent two second louvers 33a do not have an overlapping part when being viewed along the front-back direction. Thus, the interval between the two second louvers 33a is large and the ventilation efficiency of the vent P2 can be ensured.

The straight line along the front-back direction passing between the lower end 33g and the upper end 33h of the second louver 33a intersects the first louver 53a. Referring to FIG. 6, a straight line G4 passing through the lower end 33g of the second louver 33a-1 located on the upper side and the straight line G3 passing through the upper end 33h of the second louver 33a-2 located on the lower side both intersect the first louver 53a-1. Thus, the visibility of the substrate 31 through the gap between the two second louvers 33a is suppressed by the first louver 53a.

In the example of FIG. 6, the common straight line G3 passes through the lower end 53g of the upper first louver 53a-1 and the upper end 33h of the lower second louver 33a-2. Furthermore, the common straight line G4 passes through the upper end 53h of the upper first louver 53a-1 and the lower end 33g of the upper second louver 33a-1. Due to this, when the first louvers 53a and the second louvers 33a are viewed along the front-back direction, the overlapping part of them is small. As a result, the ventilation efficiency can be easily ensured.

In the example of FIG. 5, the interval between two first louvers 53a-3 and 53a-4 disposed at the upper part of the vent P1 is shorter than the other intervals. Furthermore, the lower end of the upper first louver 53a-3 is located at a position lower than the upper end of the lower first louver 53a-4. That is, between the first louvers 53a-3 and 53a-4, a straight line that passes through between them along the front-back direction does not exist.

An angle θ1 of the first louver 53a with respect to the front-back direction and an angle θ2 of the second louver 33a with respect to the front-back direction are different from each other. In the example of FIG. 6, the angle θ1 is larger than the angle θ2. By setting the angle of the first louver 53a different from that of the second louver 33a, entry of a foreign matter from the external of the electronic apparatus 1 through the vents P1 and P2 is hindered. In this description, the angle θ1 of the first louver 53a is the angle between a straight line passing through the center of the thickness direction of the first louver 53a and the front-back direction. Furthermore, the angle θ2 of the second louver 33a is the angle between a straight line passing through the center of the thickness direction of the second louver 33a and the front-back direction. In the example of FIG. 6, the angle of an upper surface of the second louver 33a with respect to the front-back direction and the angle of a lower surface of the second louver 33a with respect to the front-back direction are different from each other. Specifically, the upper surface of the second louver 33a is inclined from the front-back direction to a larger extent than the lower surface. Furthermore, an upper surface of the first louver 53a is inclined from the front-back direction to a larger extent than a lower surface. By setting the angle of the upper surface different from that of the lower surface in this manner, shaping of the first louver 53a and the second louver 33a by use of a mold is facilitated.

A space is set between the plural first louvers 53a and the plural second louvers 33a. This makes it easy for the air to flow from the vent P2 to the vent P1. In the example described here, the back wall 53 of the frame 50 is inclined from the back wall 33 of the case 32. Therefore, the direction in which the plural first louvers 53a are lined is inclined from the direction in which the plural second louvers 33a are lined. Specifically, the first louvers 53a are obliquely lined in an upward and backward direction. On the other hand, the second louvers 33a are lined in the vertical direction. Therefore, as shown in FIG. 5, between the plural first louvers 53a and the plural second louvers 33a, a space having a triangular shape in a section (section here is a plane obtained by a cutting plane perpendicular to the left-right direction) is formed. The distance between the plural first louvers 53a and the plural second louvers 33a gradually increases in the upward direction. Therefore, the air easily flows at the upper part of the case 32 compared with the lower part of the case 32. In the example shown in FIG. 5, the substrate 31 is disposed at the lower part of the case 32. This can suppress blocking of the flow of the air passing through the upper part of the case 32 after passing through the heatsink 22 by the electronic components 31a on the substrate 31.

As shown in FIG. 5, the thickness of the back wall 53 of the frame 50 and the thickness of the back wall 33 of the case 32 are different from each other. Specifically, the thickness of the back wall 33 of the case 32 is smaller than that of the back wall 53 of the frame 50. This allows increase in the volume of the case 32.

The thickness of the back wall 53 of the frame 50 becomes smaller as the position becomes closer to the lower end. The back wall 33 of the case 32 is close to the lower end of the back wall 53. Because the thickness of the back wall 53 becomes smaller as the position becomes closer to the lower end, the width (width in the front-back direction) of a first louver 53a-5 located at the lowermost part is smaller than those of the other first louvers 53a. Therefore, a second louver 33a located in front of the first louver 53a-5 (lowermost second louver 33a-3) has a vertical width larger than those of the other second louvers 33a.

As described above, the width of the case 32 in the left-right direction corresponds to the interval between the left and right sidewalls 52 of the frame 50. Furthermore, as shown in FIG. 5, the frame 50 has an upper wall 57 extending forward from an upper edge of the vent P1. A front end of the upper wall 57 reaches an upper edge of the vent P2 (upper edge of the back wall 33 of the case 32). A lower edge of the vent P2 (lower edge of the back wall 33 of the case 32) is close to a lower edge of the vent P1 (lower edge of the back wall 53 of the frame 50). Therefore, an air flow path that is surrounded by the walls 52 and 57 and is partitioned from the external is formed between the vent P2 and the vent P1. This allows the air to smoothly flow from the vent P2 to the vent P1.

As described above, the main body of the electronic apparatus 1 (frame 50, circuit board 2 attached to it, power supply unit 30, cooling fan 21, and so forth) is covered by the upper cover 3 and the lower cover 4. As shown in FIG. 2, the lower cover 4 has a back wall 4a that covers the back side of the back wall 53 of the frame 50. As shown in FIG. 3, plural openings 4b adopted to expose the vent P1 are formed in the back wall 4a. As shown in FIG. 3, the plural openings 4b are lined in the left-right direction. By making the back wall 4a in which such openings 4b are formed in the lower cover 4, the rigidity of the lower cover 4 can be ensured with suppression of the lowering of the ventilation efficiency of the vent P1.

A power supply connector 34 is provided in the case 32 of the power supply unit 30. A recess 53i (see FIG. 2) adopted to expose the connector 34 backward is formed at the lower edge of the back wall 53 of the frame 50. Furthermore, an opening 4e adopted to expose the connector 34 is formed in the lower cover 4.

As shown in FIG. 5, the frame 50 has plural ribs 53j disposed parallel to the first louvers 53a on the upper side of the vent P1. Providing such ribs 53j can increase the strength of the back wall 53. The upper cover 3 has a back wall 3a that covers the back side of the back wall 53 of the frame 50. Openings 3b adopted to expose the connectors 2a to 2d backward are formed in the back wall 3a. Furthermore, the back wall 3a of the upper cover 3 has plural openings 3c for the part in which the ribs 53j of the frame 50 are provided. As shown in FIG. 3, a lower edge 3f of the back wall 3a and an upper edge 4f of the back wall 4a are located separately from each other. The vent P1 is partially exposed between the lower edge 3f and the upper edge 4f.

As described above, the plural second louvers 33a are provided between the substrate 31 and the vent P1. The straight lines L1 to L6 along the front-back direction passing between adjacent two first louvers 53a intersect any of the plural second louvers 33a. According to this structure, the interval between the first louvers 53a can be increased and thus the ventilation efficiency can be enhanced. Furthermore, exposure of the substrate 31 through the vent P1 can be suppressed by the second louvers 33a.

The present disclosure is not limited to the above-described electronic apparatus 1 and various changes may be made.

For example, exposure of components different from the substrate 31 of the power supply circuit may be prevented by the two louvers 53a and 33a.

The back wall 53 of the frame 50, in which the first louvers 53a are formed, does not have to be inclined from the vertical direction.

The electronic apparatus 1 does not have to include the frame 50. In this case, the first louvers 53a may be formed in a back wall of a box-shaped housing to house the circuit board 2, the cooling fan 21, and so forth. Furthermore, the power supply unit 30 may be disposed inside the housing.

A space does not have to be set between the first louvers 53a and the second louvers 33a.

The present disclosure contains subject matter related to that disclosed in Japanese Priority Patent Application JP 2013-121343 filed in the Japan Patent Office on Jun. 7, 2013, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
   a component disposed inside the electronic apparatus;
   a vent located in a first direction with respect to the component disposed inside the electronic apparatus and opened toward an external environment of the electronic apparatus;
   a plurality of first louvers located in the vent and aligned and extending in a second direction perpendicular to the first direction when the vent is viewed along the first direction; and
   a plurality of second louvers located between the component disposed inside the electronic apparatus and the plurality of first louvers, and the plurality of second louvers being aligned and extending in the second direction when the vent is viewed along the first direction,
   wherein the first and second plurality of louvers are located, aligned, and extending in such a way that any straight line that passes between any two adjacent first louvers along the first direction intersects one or more of the plurality of second louvers,
   wherein at least one of: (i) a spacing between at least one pair of adjacent louvers among the plurality of first louvers is larger than a thickness of any of the plurality of second louvers, where the thickness is measured in a third direction substantially perpendicular to both the first and second directions, and (ii) a spacing between at least one pair of adjacent louvers among the plurality of second louvers is larger than a thickness of any of the plurality of first louvers, where the thickness is measured in a fourth direction substantially perpendicular to the second direction, but transverse to both the first and third directions,
   wherein at least one of: (i) a spacing between at least one pair of adjacent louvers among the plurality of first louvers is different from a spacing of at least one other pair of adjacent louvers among the plurality of first louvers, and (ii) a spacing between at least one pair of adjacent louvers among the plurality of second louvers is different from a spacing of at least one other pair of adjacent louvers among the plurality of second louvers, and wherein at least one of: (i) a thickness of at least one louver among the plurality of first louvers has a thickness that is smaller on one edge as compared to another, opposite edge, when viewed along the first direction, and (ii) a thickness of at least one louver among the plurality of second louvers has a thickness that is smaller on one edge as compared to another, opposite edge, when viewed along the first direction.

2. The electronic apparatus according to claim 1, wherein any adjacent two louvers among the plurality of first louvers do not have an overlapping part when the vent is viewed along the first direction, and any adjacent two louvers among the plurality of second louvers do not have an overlapping part when the vent is viewed along the first direction.

3. The electronic apparatus according to claim 1, wherein a straight line that passes between any adjacent two louvers among the plurality of second louvers and that is extending along the first direction intersects at least one louver among the plurality of first louvers.

4. The electronic apparatus according to claim 1, wherein the plurality of first louvers and the plurality of second louvers are angled differently from one another when viewed in the first direction.

5. The electronic apparatus according to claim 1, wherein a space is set between the plurality of first louvers and the plurality of second louvers.

6. The electronic apparatus according to claim 1, wherein:
the plurality of first louvers are located in a stacked relationship in the fourth direction, which is substantially perpendicular to the second direction, but transverse to both the first and third directions;
the plurality of second louvers are located in a stacked relationship in the third direction, which is substantially perpendicular to both the first and second directions; and
the third and fourth directions are transverse with respect to one another.

\* \* \* \* \*